Aug. 29, 1967 J. J. COLLINS ET AL 3,339,147
A-C AMPLIFIER LINEARLY CONTROLLED BY A D-C SIGNAL
Filed Jan. 14, 1965

INVENTORS
JAMES J. COLLINS
NORMAN J. LINDNER
BY
Ostrolenk, Faber, Gerb & Soffen
ATTORNEYS United States Patent Office 3,339,147

Patented Aug. 29, 1967

3,339,147

A-C AMPLIFIER LINEARLY CONTROLLED BY A D-C SIGNAL

James J. Collins, Bayside, and Norman J. Lindner, New York, N.Y., assignors to Kollsman Instrument Corporation, Elmhurst, N.Y., a corporation of New York Filed Jan. 14, 1965, Ser. No. 425,500

1 Claim. (Cl. 330—28)

ABSTRACT OF THE DISCLOSURE

An A-C transistor amplifier having a forward biased diode in the emitter circuit which is connected to a variable input to alter the dynamic impedance of the diode and thus the impedance of the emitter circuit to control the gain of the amplifier. The output circuit, connected to the transistor collector, includes a second transistor which forms a high A-C collector impedance, and a low D-C collector impedance for the A-C amplifier stage. The second transistor contains a feedback resistor in its collector-base circuit.

Figure 1:
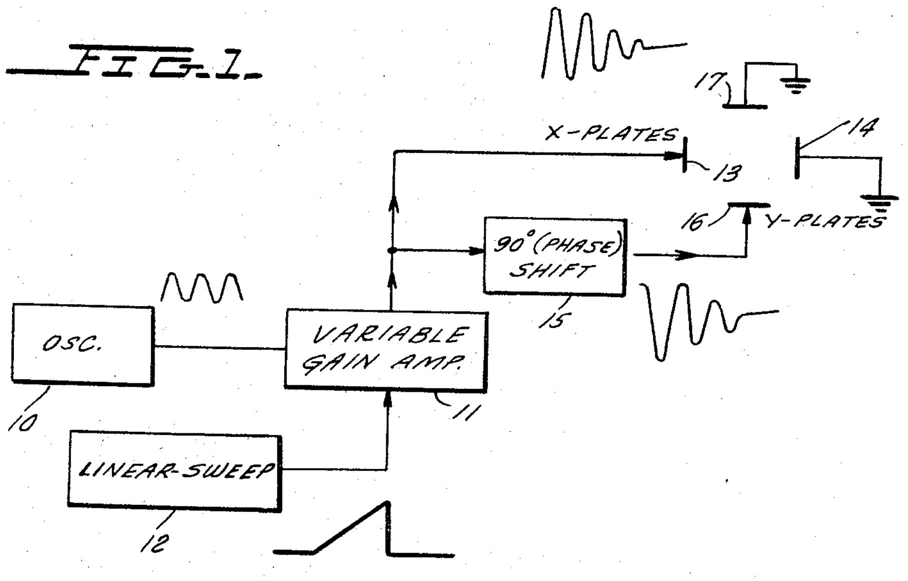

This invention relates to A-C amplifiers, and more specifically relates to a novel A-C amplifier construction whose gain is linearly controlled by an input D-C signal which controls the dynamic impedance of a diode in the emitter circuit of a transistor in the amplifier stage.

In addition, a novel artificial load circuit is provided in the transistor collector circuit which provides a high A-C collector impedance, and a low D-C collector impedance for the transistor amplifier stage.

There are many applications which require the gain of an A-C amplifier to be controlled in a linear fashion from D-C input signal. By way of example, and in order to generate a spiral scan for a cathode ray tube or for use in various types of tracking equipment, it is possible to connect an oscillator through a variable gain amplifier so that one pair of C.R.T. plates is connected to the oscillator signal, while the other pair of plates is conected to the same oscillator signal which is phase shifted by 90° from that applied to the first pair of plates.

Where the amplitude of this common frequency signal applied to both pairs of plates is equal, a perfect circle will be generated. If now, the variable gain amplifier is connected to a suitable linear sweep means, the amplitude of the circle can be constantly varied so that the resulting generated pattern will be a spiral.

The present invention relates to a particular novel A-C amplifier wherein the gain of the amplifier is linear with an input D-C signal. Therefore, in the previously noted application of the amplifier, if a saw-tooth voltage is used for the linear sweep, the resulting pattern generated will be a mathematically perfect spiral.

The novel A–C amplifier of the invention is provided with a transistor amplification stage wherein the emitter base circuit includes a forward biased diode therein connected to the input D-C source. It has been found that by varying the D-C input to the diode, the A-C impedance thereof will inversely vary with the bias over a large range. The bad impedance in the transistor collector circuit is then caused to remain relatively constant by other novel circuit means, whereupon the gain of the transistor amplifier will vary linearly with the input D-C current over a large range.

Accordingly, a primary object of this invention is to provide a novel A-C amplifier circuit whose gain varies linearly with an input D-C current.

Yet another object of this invention is to provide a novel A-C transistor amplifier which uses a forward biased diode in the emitter circuit thereof.

Still another object of this invention is to provide a novel A-C amplifier which has a variable gain which is linear with an input D-C current wherein the resistance in the emitter circuit of a transistor used as the amplifier element varies linearly with the impressed D-C current, while the resistance in the collector circuit of the transistor is held relatively constant.

Still another object of this invention is to provide a novel amplifier circuit used in the generation of spiral patterns.

These and other objects of this invention will become apparent from the following description when taken in connection with the drawings, in which:

FIGURE 1 schematically illustrates a spiral scanning generator which uses a variable gain amplifier which is linearly controlled.

Figure 2:
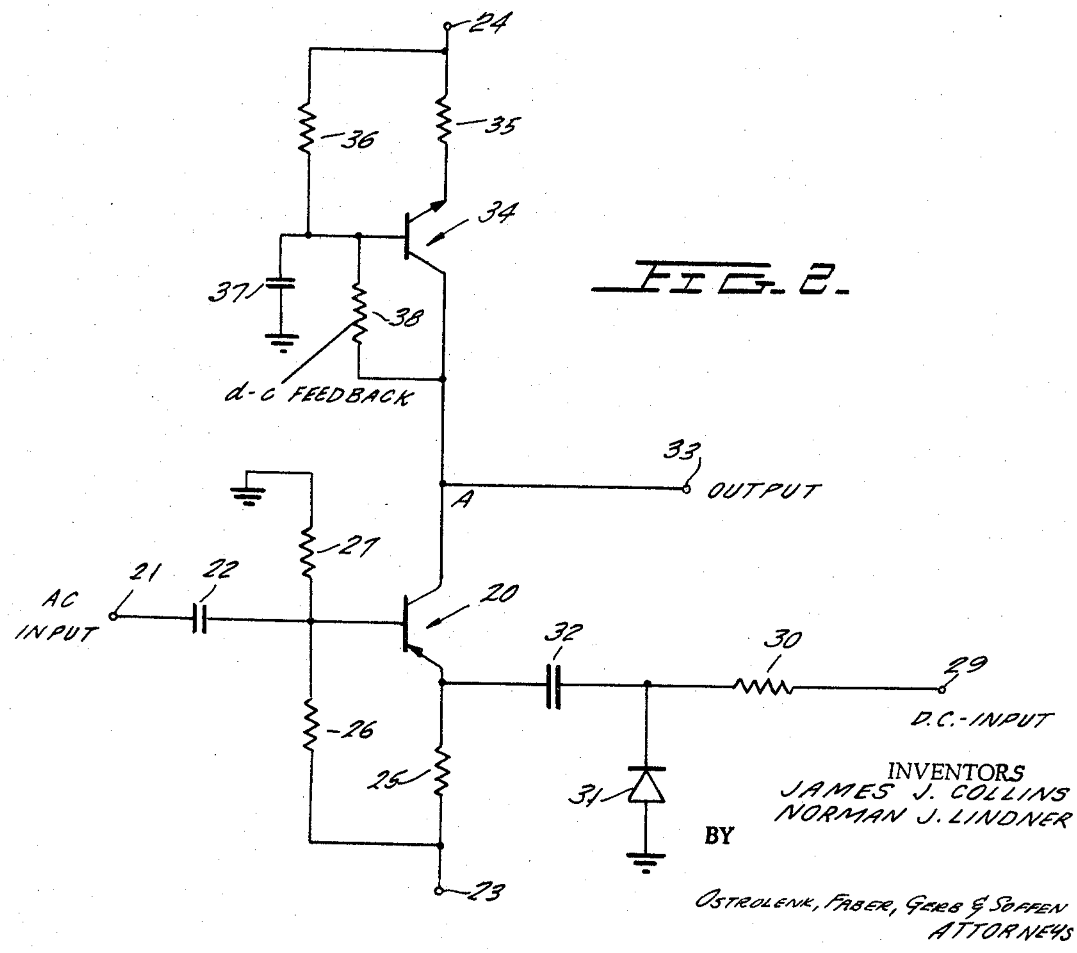

FIGURE 2 is a circuit diagram of the novel amplifier used in FIGURE 1 in accordance with the invention.

Referring first to FIGURE 1, we have illustrated therein a novel spiral generator wherein an oscillator 10 is connected to the input terminals of a variable gain amplifier 11. A linear sweep generator 12 which generates a repetitive saw-tooth pattern, as illustrated adajacent linear sweep generator 12, is then connected to other input terminals of the variable gain amplifier. The output terminals of the variable gain amplifier are then connected directly across a first set of deflection plates 13 and 14 of some suitable display means such as a cathode ray tube or any other similar type apparatus which electrostatically modulates the position of an electrical charge.

The output of amplifier 11 is further connected through a 90° phase shift network 15 to deflection plates 16 and 17 which creates an electrostatic field perpendicular to the field of plates 13 and 14. When the amplitude of the signals applied to plates 13–14 and 16–17 is equal, it is well known that the charge medium controlled by these plates will be caused to execute a circular deflection.

In accordance with the invention, the variable gain amplifier 11 has the gain thereof linearly and repetitively changed as a function of time by means of the linear sweep generator 12 whereupon the amplitude of the signal applied to plates 13, 14, 16 and 17 will repetitively increase, thus repetitively increasing the diameter of the circuit generated thereby, whereupon the resulting pattern formed will be a spiral.

FIGURE 2 illustrates a circuit diagram of the variable gain amplifier 11 of FIGURE 1. Thus, in FIGURE 2, the amplifier is comprised of a transistor 20 which has an A-C input terminal 21 coupled to the base thereof through a coupling capacitor 22. The terminal 21 in FIGURE 2 is equivalent to the input circuit from oscillator 10 in FIGURE 1.

A biasing voltage source is then provided at terminals 23 and 24 which could, for example, apply +12 volts with respect to ground to terminal 23 and −12 volts with respect to ground at terminal 24. Suitable biasing resistors 25, 26 and 27 are then provided in the usual manner. Biasing resistor 25 may be a 5K resistor.

A D-C input terminal 29 which is equivalent to the input from linear sweep generator 12 in FIGURE 1 is then connected through a 27K resistor 30, and forward biases a diode 31 which is connected to ground. Resistor 30 is also connected through a blocking condenser 32 to the emitter circuit of transistor 20. Transistor 20 is then connected to an output terminal 33 which is equivalent to the output circuit of variable gain amplifier 11 in FIGURE 1 leading to deflection plates 13, 14, 16 and 17.

In addition to this, the collector circuit of transistor 20 includes a high A-C impedance-low D-C load impedance circuit which includes transistor 34 having an emitter resistor 35 connected to terminal 24 and a 22K emitter base resistor 36 connected to a capacitor 37 and a D-C feedback resistor 38 which could be 22K.

The following is a list of components that have given satisfactory operation for the circuit.

| | | |
|---|---|---|
| Transistor **20** | Type No. 2N404 | |
| Transistor **34** | Type No. 2N1304 | |
| Capacitor **22** | microfarads | 10 |
| Capacitor **32** | do | 40 |
| Capacitor **37** | do | 10 |
| Resistor **25** | | 5.1K |
| Resistor **26** | | 22K |
| Resistor **27** | | 9.1K |
| Resistor **30** | | 27K |
| Resistor **35** | | 1K |
| Resistor **36** | | 22K |
| Resistor **38** | | 22K |

The principle of operation of the circuit shown in FIGURE 2 involves the fact that the dynamic impedance of diode 31 changes inversely with the D-C current applied to terminal 29 over a large range. The gain of the amplifier transistor 20 is equal to the ratio of the collector circuit resistance to the emitter circuit resistance.

In the circuit of FIGURE 2, the emitter resistor 25 is used as a D-C bias for the stage. However, for A-C gain considerations, the effective emitter resistance is the resistance of resistor 25 in parallel with the dynamic resistance of diode 31. This dynamic resistance or A-C impedance can be controlled from 27K which is the value of resistor 30, assuming that the impedance of diode 31 is infinite, down to as low as 20 ohms by changing the reverse current through diode 31. Therefore, when the collector load resistance is fixed, it will be apparent that gain can be linearly controlled over a very large dynamic range by varying the D-C voltage at terminal 29.

The collector load resistance circuit is held relatively constant by the novel use of the transistor circuit including transistor 34. Thus, transistor 34 performs two functions. It first serves as a very low D-C impedance which is necessary for biasing considerations which will hereinafter be discussed, and at the same time, it will have a very high equivalent A-C impedance which is necessary for a large dynamic range. This is accomplished by using a D-C feedback circuit which includes resistor 38 and an A-C by-pass which includes capacitor 37. Thus, the D-C feedback resistor 38 will fix the D-C voltage appearing at point A so that point A is caused to appear as a voltage source which has a low D-C impedance. The capacitor 37 then forms an A-C short circuit on the base of transistor 34 which will prevent any A-C signal from being fed back through transistor 34. The resistor 38 will also appear as the A-C load in the collector circuit of transistor 20 and thus forms the required high A-C impedance in this collector circuit.

The need of a low D-C collector resistance and high A-C impedance for transistor 20 is that the D-C current through diode 31 will determine its dynamic impedance, while the A-C current through diode 31 will determine the stage gain. Therefore, it is necessary that the A-C current be smaller than the D-C current to prevent unwanted interaction which would degenerate the linearity of the amplifier.

Since the A-C current through diode 31 must be small, the A-C collector resistance in the transistor must be correspondingly large to give a sufficient voltage swing. At the same time, and if a large resistor is placed in the collector circuit, this would make biasing very difficult, if not impossible.

A close examination of FIGURE 2 reveals that there is in fact another diode in series with the control diode 31 which is defined by the base-to-emitter diode junction of transistor 20. To insure that the gain of transistor 20 is controlled only by the current through diode 31, it is necessary that the impedance of this transistor junction be as small as possible. This is accomplished by having a large D-C current flow through the base-to-emitter diode junction of transistor 20. The equivalent diode impedance of this transistor diode is given by $25/I_{dc}$ in milliamperes, where $I_{dc}$ is the current through the base-to-emitter junction.

In order to guarantee sufficient D-C current flow, the second requirement mentioned above of low D-C impedance occurs. Thus, the resistance of diode 31 is approximately equal to $25k/I_{dc}$ where $k$ varies from 1 to 2 for silicon and is about 1 for germanium.

Therefore, the instantaneous voltage gain at point A will be equal to $$\frac{R_c}{R_e}=\frac{R_c}{R_{\text{diode 31}}}=\frac{R_c}{25k}I_{dc}$$

where $R_c$ is the impedance of the collector circuit connected to the collector of transistor 20 and $R_e$ is the emitter resistance of transistor 20.

It will, therefore, be apparent that the voltage at point A will be linearly related to the D-C current applied at terminal 29.

Although this invention has been described with respect to its preferred embodiments, it should be understood that many variations and modifications will now be obvious to those skilled in the art, and it is preferred, therefore, that the scope of the invention be limited not by the specific disclosure herein but only by the appended claim.

The embodiments of the invention in which an exclusive privilege or property is claimed are defined as follows:

An A-C amplifier having a linear gain comprising a first transistor having a base, emitter, and collector electrode, an A-C input circuit connected to said base electrode, a variable D-C input circuit connected to said emitter electrode for controlling the gain of said first transistor, and an output circuit connected to said collector electrode; said D-C input circuit including a forward biased diode in series with the emitter-base circuit of said first transistor; the dynamic impedance of said forward biased diode being inversely related to the D-C current of said D-C input circuit whereupon the gain of said first transistor is linearly related to the D-C current of said D-C input circuit; and a second transistor for forming an impedance in the collector circuit of said first transistor having a low D-C impedance and a high A-C impedance; said second transistor having second base, emitter and collector electrodes; said collector electrode of said first transistor directly connected to said collector electrode of said second transistor; said second transistor base to collector circuit having a feedback resistor connected thereacross; said second base electrode having a capacitor connected thereto and extending to said base electrode of said transistor; and biasing circuit means connected in series with said emitter and collector electrodes of said first and second transistors.

References Cited

UNITED STATES PATENTS

| | | | |
|---|---|---|---|
| 3,023,369 | 2/1962 | Horowitz | 330—145 X |
| 3,223,937 | 12/1965 | McDonald | 330—29 X |

FOREIGN PATENTS

| | | |
|---|---|---|
| 852,059 | 10/1960 | Great Britain. |
| 853,870 | 11/1960 | Great Britain. |

ROY LAKE, *Primary Examiner.*

J. B. MULLINS, *Assistant Examiner.*